(12) United States Patent
Unal

(10) Patent No.: US 11,316,470 B2
(45) Date of Patent: Apr. 26, 2022

(54) SOLAR POWER PLANT DESIGN WITH UNDERGROUND LIGHT ROOM

(71) Applicant: Can Baran Unal, Istanbul (TR)

(72) Inventor: Can Baran Unal, Istanbul (TR)

(73) Assignee: Can Baran Unal, Istanbul (TR)

( * ) Notice: Subject to any disclaimer, the term of this patent is extended or adjusted under 35 U.S.C. 154(b) by 0 days.

(21) Appl. No.: 16/957,938

(22) PCT Filed: Dec. 26, 2017

(86) PCT No.: PCT/TR2017/050695
§ 371 (c)(1),
(2) Date: Jun. 25, 2020

(87) PCT Pub. No.: WO2019/132788
PCT Pub. Date: Jul. 4, 2019

(65) Prior Publication Data
US 2020/0350856 A1      Nov. 5, 2020

(51) Int. Cl.
*H02S 40/22* (2014.01)
*H02S 20/32* (2014.01)
*H02S 40/42* (2014.01)

(52) U.S. Cl.
CPC ............. *H02S 40/22* (2014.12); *H02S 20/32* (2014.12); *H02S 40/425* (2014.12)

(58) Field of Classification Search
CPC ........ H02S 40/22; H02S 40/425; H02S 20/32; H02S 10/00
See application file for complete search history.

(56) References Cited

U.S. PATENT DOCUMENTS

| 2009/0014053 A1* | 1/2009 | Schulz ............... H01L 31/0521 136/246 |
| 2011/0056485 A1* | 3/2011 | Saluccio ............... F24S 23/30 126/621 |

FOREIGN PATENT DOCUMENTS

| EP | 0 641 896 A2 | 3/1995 |
| JP | 2009 270919 A | 11/2009 |
| KR | 2011 0046070 A | 5/2011 |

OTHER PUBLICATIONS

Solar power goes underground, Discovery News, 2013.*
International Search Report, European Patent Office, dated Mar. 27, 2019.
Written Opinion of International Searching Authority, European Patent Office, dated Mar. 27, 2019.

* cited by examiner

*Primary Examiner* — Sadie White

(57) ABSTRACT

A new solar power plant design that utilizes a "Light Room" built underground, commercially available mirrors used in CSP and CPV power plants, and also commercially available PV modules. The usage of a Light Room built underground significantly increases sunlight to electricity conversion efficiency by a higher percentage of sunlight directed towards the PV modules, which are kept cool and clean via fans. Construction, operations and maintenance become easier, faster and cheaper. Overall land usage requirement, investment cost per unit installed power and LCOE are significantly reduced. The design allows installation in rural and urban areas, making it possible for applications not feasible with the current state of the art.

2 Claims, 4 Drawing Sheets

SOLAR POWER PLANT DESIGN WITH UNDERGROUND LIGHT ROOM

CROSS REFERENCE TO RELATED APPLICATION

This application is for entry into the U.S. National Phase under § 371 for International Application No. PCT/TR2017/050695 having an international filing date of Dec. 26, 2017, and from which priority is claimed under all applicable sections of Title 35 of the United States Code including, but not limited to, Sections 120, 363, and 365(c).

TECHNICAL FIELD

The present disclosure relates to a new solar power plant design that utilizes a "Light Room" built underground, commercially available mirrors used in concentrated solar power (CSP) and concentrated photovoltaic (CPV) solar power plants, and also commercially available photovoltaic (PV) modules. Contrary to conventional PV and CSP power plants, the PV modules are placed underground in a Light Room. Sunlight is directed and trapped inside the Light Room by utilizing various arrays of mirrors. This design facilitates higher electricity generation by redirecting sunlight reflected off the PV modules back on to them, keeping the surface of the PV modules clean and also their temperatures below the operational values of conventional solar power plant designs to increase electricity production per unit area. Maintenance and operational costs are decreased by keeping dust, dirt and outside factors away from the PV modules, thus lowering or eliminating the need for periodic cleaning. The design facilitates easy servicing of and access to PV modules and cabling, from a service chamber constructed behind the wall of PV modules. Construction is easier, cheaper and permits faster installation, possibly by utilizing pre-assembled frames or cassettes carrying the PV modules to be put into place. Environmental footprint is decreased by moving PV frames and modules underground, only to leave above ground three sets of mirror arrays and a gate with adjustable rotating flaps for the passage of sunlight. A big portion of the land usage associated with conventional solar power plant designs is saved by utilizing a Light Room built underground, making way for farming or other conventional purposes.

BACKGROUND ART

This section provides background information related to the present disclosure.

Mirrors are generally used in CSP and CPV solar power plants in many different configurations. All different solar facility designs incorporate above-ground construction elements. Electric power is generated either directly by concentrating sunlight over PV modules, or over tubes carrying molten salt or other high heat capacity fluids, which in turn transfer their heat to boil water, which then turns a steam turbine-generator set to produce electricity.

Shockley-Queisser limit or detailed balance limit refers to the calculation of the maximum theoretical efficiency of a solar cell made from a single P-N junction. It was first calculated by William Shockley and Hans Queisser.

Ref.: William Shockley and Hans J. Queisser: "Detailed Balance Limit of Efficiency of p-n Junction Solar Cells", Journal of Applied Physics, Volume 32, pp. 510-519 (1961)

Main hurdles in front of solar plants to operate near the theoretical Shockley-Queisser limit can be gathered under these main topics:

Effect of Light Reflection: Sunlight reflected from the PV modules reduce the percentage of absorbed sunlight and thus the power generated.

Maximum photovoltaic module efficiency requires that incident sunlight is not reflected en route to the absorber layer, and that light that does enter this layer is not subsequently reflected back out, or transmitted through the cell.

A variety of anti-reflection technologies have been deployed in PV modules and the topic remains the subject of active research. Anti-reflection technologies can be broadly split into two categories: 1) Anti-reflective coatings (ARCs) reduce reflection at interfaces above the light absorbing layer of cells; and 2) Texturized surfaces serve the dual purpose of increasing light transmittance and also trapping light within the absorber layer. Often the most effective strategies employ a combination of these techniques.

Ref.: Dan M. J. Doble, John W. Graff, Fraunhofer Center For Sustainable Energy Systems, Massachusetts Institute of Technology, Cambridge Mass. USA, http://www.renewableenergyworld.com/articles/2009/03/minimization-of-reflected-light-in-photovoltaic-modules.html Effect of Temperature: PV module temperature and yield are inversely related, therefore overall efficiency is lowered as the PV modules are exposed to more sunlight and heat up. The blackbody radiation from a solar cell at room temperature (300° K) cannot be captured by the cell, and represents about 7% of the available incoming energy. Energy lost in a cell is generally turned into heat, so any inefficiency in the cell increases the cell temperature when it is placed in sunlight. As the temperature of the cells increases, the blackbody radiation also increases, until equilibrium is reached. In practice this equilibrium is normally reached at temperatures as high as 360° K, and cells normally operate at lower efficiencies than their room temperature rating.

An unwanted side-effect of the encapsulation of solar cells into a PV module is that the encapsulation alters the heat flow into and out of the PV module, thereby increasing the operating temperature of the PV module. These increases in temperature have a major impact on the PV module efficiency by reducing its voltage, thereby lowering the output power. In addition, increases in temperature are implicated in several failure or degradation modes of PV modules, as elevated temperatures increase stresses associated with thermal expansion and also increase degradation rates by a factor of about two for each 10° C. increase in temperature.

Ref.: http://ph.qmul.ac.uk/sites/default/files/u75/Solar%20cells_environmental%20impact.pdf Effect of outside elements like dust, dirt, rain, wind, snow, storm, etc.: Effects of climatic parameters on the performance of PV panels were examined through detailed analysis of the performance of two existing PV installations in relation to their weather exposure. Results for the indoor experiments showed that even a small amount of fine particles could reduce light transmittance by as much as 11%. Distribution analysis of dust collected from the exposed glass units revealed particle sizes were smaller than 400 microns with the highest frequency under 20 microns but the impact on solar transmission through the glass was mere 5% after exposure of four weeks due to the frequent rainy days. Amongst a wide range of climatic parameters used in the statistical analysis, high humidity, rain and snow were found to have significant effects to the efficiencies of the two PV installations, which in some cases could annihilate any system output. This study has also revealed the geographical issue of birds in this coastal city as their droppings can create overheated spots on the PV panel and reduce its output.

Ref.: The effect of weather conditions on the efficiency of PV panels in southeast of UK https://www.researchgate.net/publication/261218699 The effect of weather_conditions_on_the_efficiency_of_PV_panels_in_southeast_of_UK Effect of land usage: A fourth factor that is not directly related to solar power efficiency but has negative effects in general is the large amount of land usage necessary for solar power plants.

The amount of land usage necessary for conventional PV and CSP solar power plants sometimes produce the adverse effect of giving up the opportunity of farming in exchange for electricity production. One study published in 2015 and carried out by Rebecca R. Hernandez of Carnegie Mellon University (now at UC-Berkley and Lawrence Berkeley National Lab), Madison K. Hoffacker (now at UC-Riverside's Center for Conservation Biology), and colleagues, published in the Proceedings of the National Academy of Sciences, assessed the siting impacts of 161 existing, under construction, and planned utility-scale solar energy facilities in California.

The study found that 30% of all such solar power plant installations lay in croplands or pasture, adversely affecting farming practices and food production capacity. One possible cure suggested by the study was to reduce the space between rows of PV modules and arrays of mirrors.

With the new solar power plant design presented herein, the impact of solar power plant installation is massively reduced since PV modules and associated equipment for electricity production is moved underground, only to leave the primary and secondary array of mirrors, the adjustable rotating flaps and the gate above ground.

Ref.: https://carnegiescience.edu/news/solar-energy's-land-use-impact

Reducing the need for land usage also has the advantage of a lesser impact on wildlife.

DISCLOSURE OF INVENTION

This section provides a general summary of the disclosure, and is not a comprehensive disclosure of its full scope or all of its features.

The present disclosure provides a a different approach to a solar power plant design than current CSP and PV designs by combining existing reflection-based solar power technology and commercially available PV modules. Two primary arrays of concave mirrors that are placed in straight lines opposing each other gather and focus sunlight towards the inner reflective side of a secondary array of mirrors which is placed higher above ground and runs parallel to a gate. The focused sunlight is in turn reflected in angles that direct the rays towards the focal point of the secondary array of mirrors. The sunlight that is thus reflected, is transmitted past a gate, an open channel dug on the ground which runs along a line intersecting the projection of the secondary array of mirrors. The gate is equipped with a pair of adjustable rotating flaps which are also covered with mirrors on the inner sides facing each other. The sunlight passes through the gate into a "Light Room" built underground; whereby sunlight is directed towards a "Wall of PV modules" to produce electricity. Light that is not absorbed and reflected off the PV modules gets trapped inside the Light Room by means of mirrors mounted on two side walls, floor and the ceiling of the Light Room, the inside surfaces of the adjustable rotating flaps and the two sides of a protrusion which runs parallel to the wall of PV modules and hangs from the ceiling of the Light Room. This way, light that is reflected off the PV modules is reflected back towards them for virtually an unlimited number of times, thus significantly enhancing the conversion efficiency of PV modules and generating much more power per unit of installation.

The Light Room is a chamber constructed underground which houses the following:

A gate dug along a line parallel to the projection of the secondary array of mirrors; equipped with a pair of adjustable rotating flaps whose inner surfaces are covered with mirrors and whose angles can be changed for maximum amount of sunlight directed inside the Light Room One wall covered fully with commercially available PV modules to produce electricity Two side walls, floor and the ceiling covered with mirrors designed to trap sunlight that is reflected off the PV modules inside the room and send them back to the PV modules A protrusion that runs parallel to the gate and placed on the ceiling, both sides of which are also covered with mirrors A cooling and pressurizing HVAC system composed of a wall covered with fans to create a positive differential air pressure inside the Light Room to keep dust, dirt and other outside elements away; while also keeping the PV modules cool in order to increase electricity production. This cooling and pressurizing HVAC system may be of a conventional design and use commercially available components. However, it may be designed in any other way not to cover one full side wall, for the purpose of employing more mirrors to increase sunlight directed towards the PV modules and thus increasing the electricity production A service chamber behind the wall of PV modules to facilitate easy access for maintenance, servicing, periodic checks or replacement of the PV modules, which also houses the cabling running from the PV modules to a combiner box Electricity produced this way is then transmitted from the combiner box to a step-up transformer and finally to the grid in any one way of conventional electricity transmission system designs. Other use cases may include urban or rural, on-grid or off-grid, commercial and residential buildings, recreational areas, hospital, universities and similar establishments.

BRIEF DESCRIPTION OF DRAWINGS

The drawings described herein are for illustrative purposes only of selected embodiments and not all possible implementations, and are not intended to limit the scope of the present disclosure.

BEST MODE FOR CARRYING OUT THE INVENTION

Example embodiments will now be described more fully with reference to the accompanying drawings.

Figure 1:
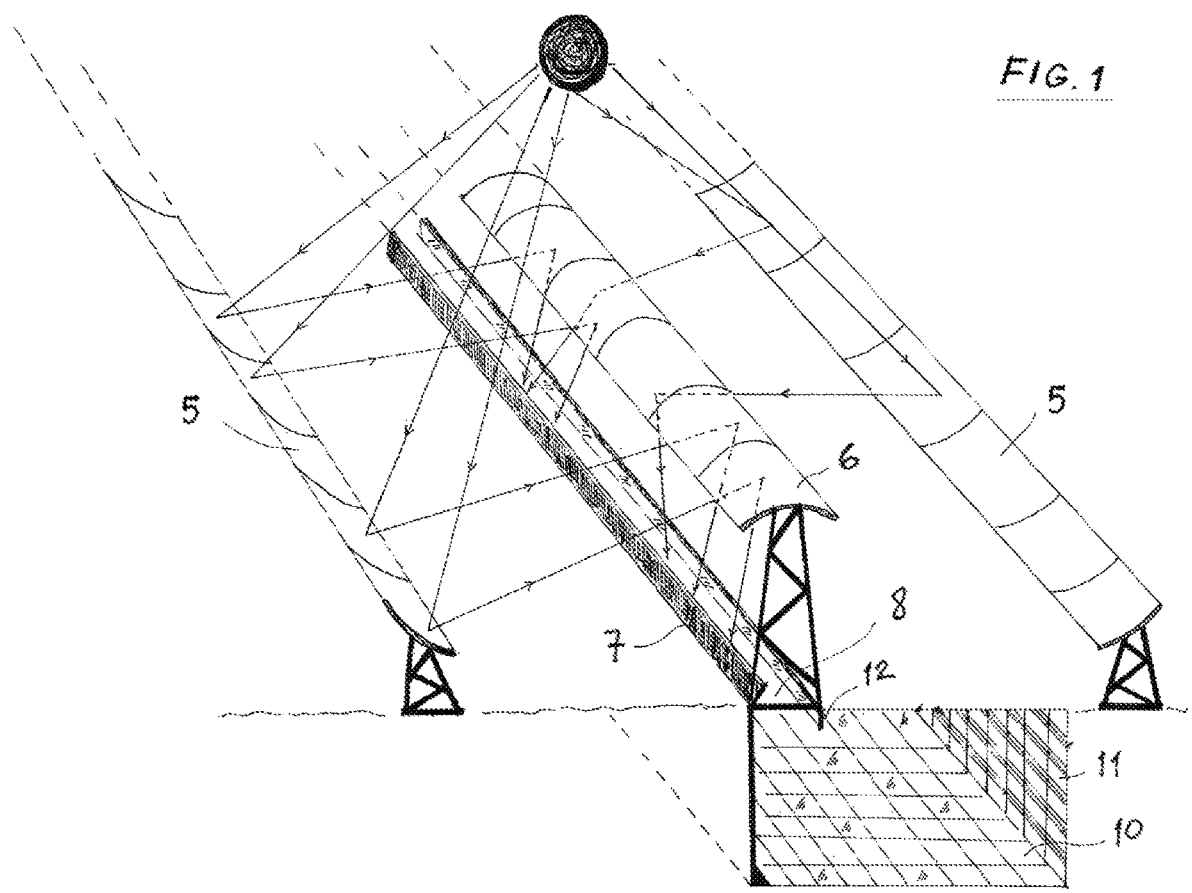
FIG. 1 illustrates the general setup of the presented solar power plant design. Different paths of sunlight beams can be seen reflecting from various mirror surfaces, seen as solid and dashed black lines, before they reach inside the Light Room. The system utilizes two primary arrays of commercially available concave mirrors placed opposite each other on the ground, a secondary array of concave mirrors placed higher from the primary arrays and facing downward, a pair of adjustable rotating flaps, a gate and a Light Room; one wall of which is fully covered with PV modules, two side walls, floor and the ceiling of which are fully covered with mirrors and one wall of which contains fans to create a positive differential air pressure to keep outside elements like dust and dirt away from PV modules and also cool them.

FIG. 1 illustrates two sets of primary arrays of mirrors 5, which are of commercially available concave type, placed opposite to each other on the ground. Primary arrays of mirrors 5 run parallel to the gate 8 and have curvatures and focal points adjusted such that sunlight is reflected towards the secondary array of mirrors 6, which in turn reflect the sunlight past the adjustable rotating flaps 7, the gate 8 and into the Light Room 9. The inside surfaces of the adjustable rotating flaps 7 are also covered with mirrors to increase the amount of sunlight reflected towards inside the Light Room 9. The primary array of mirrors 5, secondary array of mirrors 6, the adjustable rotating flaps 7, as well as the gate 8 may have amounts, types, focal points and type of mirrors, as well as lengths chosen with respect to the design criteria and planned power capacity of the solar power plant. The foundations above the ground and orientations with respect to each other, of the primary arrays of mirrors 5, secondary arrays of mirrors 6, adjustable rotating flaps 7 and the gate 8 is for illustrative purposes only and can be changed with respect to the design criteria and optimum power output of the solar power plant. The side wall of the Light Room 9 which is covered with PV modules 11, and the floor of the Light Room 9 covered with mirrors 10 can be seen partially. The length of the floor of the Light Room 9 is illustrated to be running underground towards the other side that contains the fans, with dashed lines. The Light Room 9 is illustrated as a rectangular space built underground, however it can be constructed in another three dimensional shape so as to optimize the construction process and power output of the solar power plant design.

Figure 2:
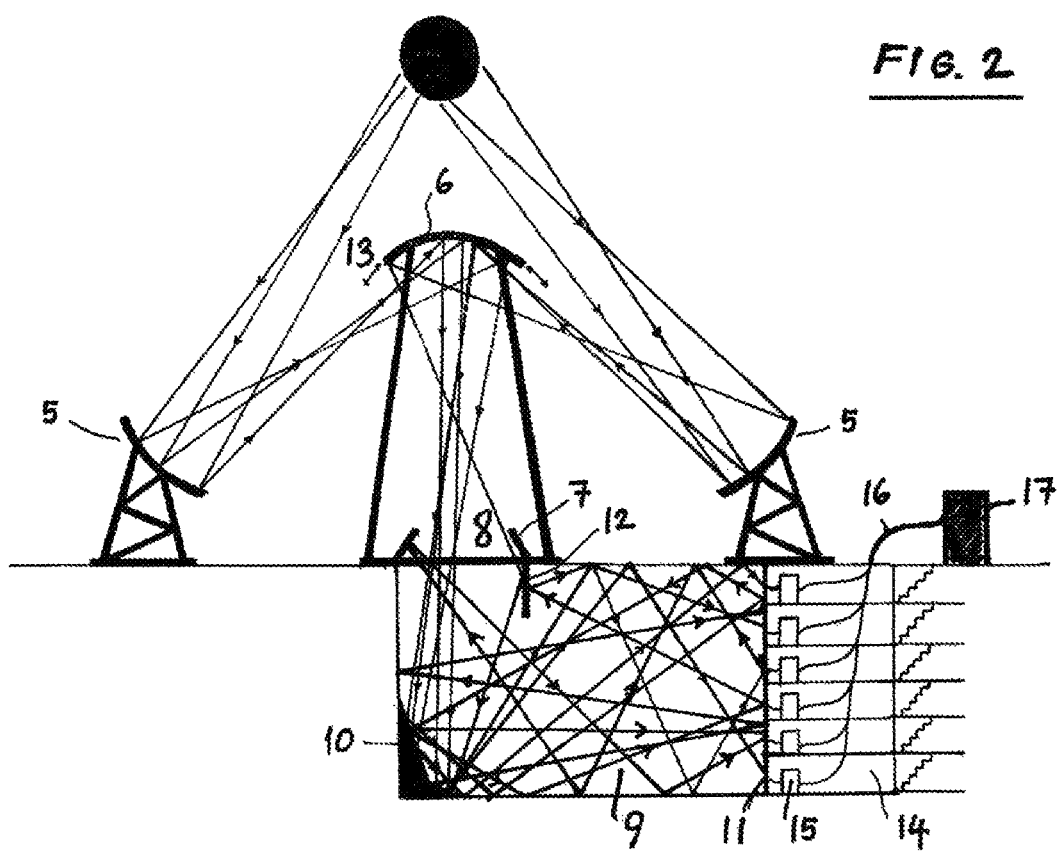
FIG. 2 illustrates the working principle of the electricity production, whereby sunlight is reflected back and forth inside the Light Room, which effectively traps as much sunlight as possible. Many representations of sunlight initially reaching the primary array of mirrors with different angles can be traced till they either reach the wall covered with PV modules directly; or reach the PV modules after they get reflected from either of the surfaces covered with mirrors, inside and outside surfaces of the adjustable rotating gates or the protrusion, seen as returning lines. The back side of the wall covered with PV modules contain a service chamber for easy access to the PV modules for installation, maintenance and operational purposes; and also cabling that runs from the PV modules to a combiner box.

FIG. 2 illustrates the way sunlight travels respectively from the primary array of mirrors 5, to the secondary array of mirrors 6, passing directly through or reflected from the adjustable rotating flaps 7, past the gate 8, into the Light Room 9, reclecting from various surfaces and with various angles from the mirrors 10 covered on the floor, ceiling, two side walls and both sides of the protrusion 12; finally reaching the PV modules 11 placed on the other side wall. Solid lines represent the rays of sunlight directly reaching the PV modules 11, while returning lines represent rays of sunlight reflected off the PV modules once and returning back towards them after being reflected several times from the mirror covered surfaces. The Light Room 9 facilitates virtually an unlimited amount of reflection, thus effectively trapping the sunlight inside it and feeding the PV modules 11 with much more sunlight than conventional designs. The primary array of mirrors 5, secondary array of mirrors 6 may or may not be equipped with a tracking mechanism 13, and the adjustable rotating flaps 7 may be positioned by opening or closing radially to capture the maximum amount of sunlight inside the Light Room 9 during the day. For maintenance, replacement of the PV modules 11, other operational reasons or in an emergency situation like heavy rain, snow, storm, earthquake, flood, etc., the adjustable rotating flaps 7 may be closed to shut down the plant and protect sensitive equipment. The mirrors 10 may be flat or of any other geometry; and placed in line or with any other orientation designed for maximum electricity production. FIG. 2 shows an example design whereby only the corner side of the floor is covered with flat mirrors placed in an inclined way. A service chamber 14 houses the cabling 16 running from behind the PV modules 11, passing through string inverters 15, towards a combiner box 17; all equipment also of the commercially available type and installed in one of the conventional layout designs. The layout of the electricity transmission equipment is shown to contain commercially available string inverters 15 between the PV modules 11 and the combiner box 17, however this configuration is intended for representational purposes only and not intended to limit the scope of the design; any one type of solar power plant designs conventionally used may be chosen for the installation. The service chamber 14 may be designed as a plain space with a staircase, a chamber with appropriate gangways for cabling or as a control room with online energy production monitoring with space for working personnel. The primary function of the service chamber 14 is to provide easy access to the PV modules 11 for installation, maintenance or replacement.

Figure 3:
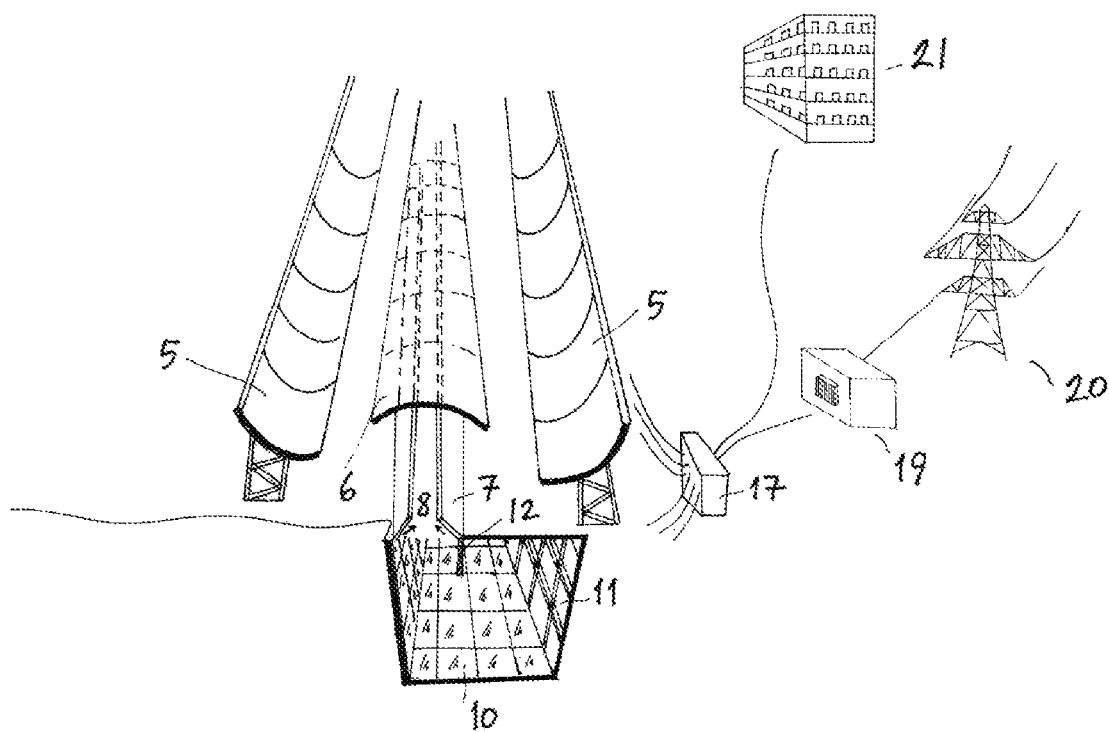
FIG. 3 illustrates a perspective view of FIG. 2, with the addition of the way electricity thus produced is transmitted from the PV modules for end usage for two different examples shown together. The grid connection example is shown to contain the path from respectively string inverters, a combiner box, a step-up transformer and the grid. The commercial building example is shown with the connection from the combiner box to the building.

FIG. 3 is a perspective view of the solar power plant design thus far explained, illustrating the final part of the path that the electricity produced is transmitted. Two examples of industrial and commercial applicability is shown on the same drawing for ease of understanding; one is a rural application with a grid connection, wherein produced electricity gets transmitted respectively from the PV modules 11, to the combiner box 17, a step-up transformer 19 and the grid connection 20. The other example is a commercial or residential building 21 with off-grid usage employing different pieces of solar power equipment, not shown in detail. Both of the example applications are for illustrative purposes only and do not intend to limit the scope of the design or equipments to be used.

Figure 4:
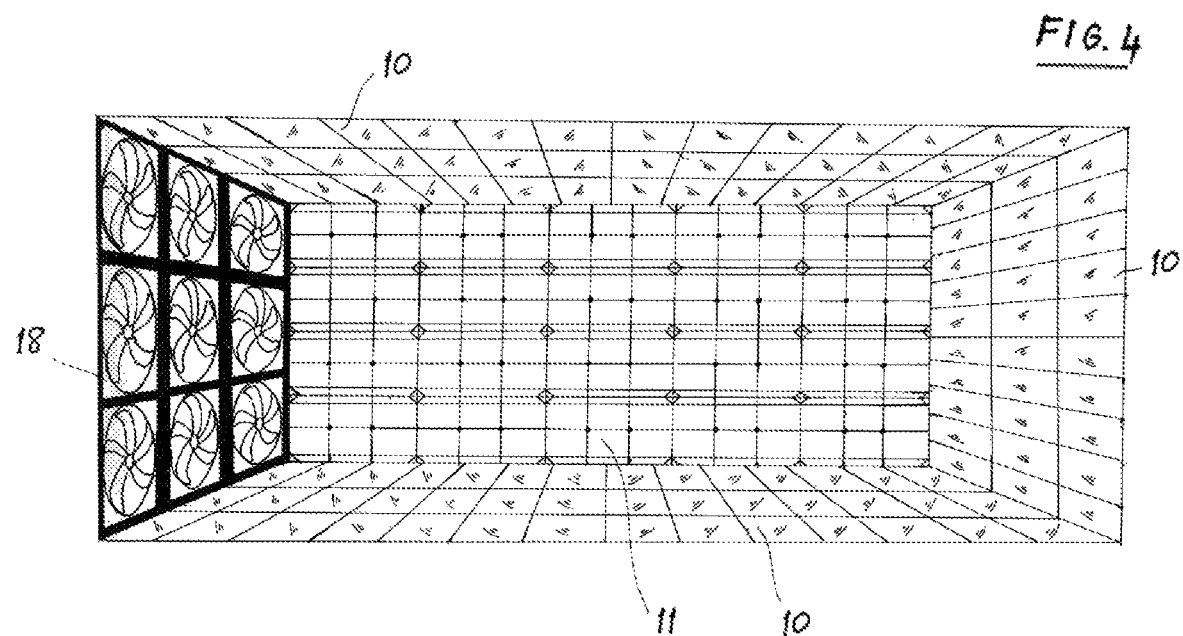
FIG. 4 illustrates a perspective section view of the Light Room from the point of view of the wall facing the PV modules. The front wall is fully covered with PV modules, the left side wall contains the fans which cool the PV modules, create a positive differential air pressure and help keep the Light Room free of outside elements; while the other two walls and the ceiling are covered with mirrors to reflect and trap the sunlight inside.

FIG. 4 illustrates a cut away view of the Light Room 9, showing the side wall that is covered with PV modules 11.

The type, amount, number or rows and amount per row of PV modules 11 can be chosen in any way with respect to the design criteria and power output requirements of the solar power plant. The ceiling, floor and right side wall of the Light Room 9 can be seen covered with mirrors 10, the type and orientation of which can also be chosen with respect to design criteria. Fans 18 can be seen installed on the left side wall, which perform the tasks of creating a positive differential air pressure inside the Light Room 9 to keep dust, dirt and other outside elements that negatively effect the power output of the plant or pose operational risks; and also cooling the PV modules 11 to increase their electricity production efficiency. The intake port of the fans can be placed in any convenient location. Suitable filtering equipment, possibly of HEPA type, shall be used not to degrade the conversion efficiency of the PV modules 11. This design layout is for illustrative purposes only and does not intend to limit the scope of creating the pressurizing and cooling functions of the system. The usage of fans on one side wall of the Light Room 9 produces the outcome of decreasing the amount of sunlight reflection towards the PV modules 11, and thus electricity production. Therefore, another design using less wall space in the Light Room 9, or an HVAC system placed completely outside the Light Room 9, possibly behind the wall covered with PV modules 11, to achieve a positive differential air pressure and enough cooling effect on the PV modules can also be employed.

INDUSTRIAL APPLICABILITY

The presented disclosure is a new solar power plant design utilizing a different configuration of existing technology.

The solar power plant design makes use of an underground Light Room to install PV modules for electricity production. This design, as presented in the Background Art section solves many different problems currently faced in the solar industry.

Firstly, the use of an underground Light Room significantly increases the amount of sunlight converted to electricity by the PV modules, by utilizing mirrors.

Secondly, the cooling system in the Light Room increases the electricity production further by cooling the PV modules to a desired temperature.

Thirdly, the isolating property of the Light Room due to a positive differential air pressure keeps dust, dirt and outside particles away from the PV modules, thereby increasing the electricity production further.

Fourthly, the design of the Light Room facilitates cheaper and faster construction and installation, easier servicing, keeping critical equipment out of danger in serious natural events, as well as less operation and maintenance costs during the lifetime of the solar power plant.

Fifthly, the installation of PV modules, cooling system and the service chamber underground saves valuable land which can be used for farming or other conventional purposes.

Sixthly, land that is thus saved lets this design be applicable for both rural, grid-connected types, and also commercial or residential grid-connected or off-grid types of investments.

All of these factors together significantly reduce the levelized cost of energy (LCOE) for the presented design, amount of investment for unit installed power, as well as the need for large scale land usage. The presented design therefore opens up new possibilities for investments that are not feasible with the current state of the art.

The presented solar power plant design can be applied for rural areas, commercial and residential buildings, hospitals, universities, parks, recreational areas or similar establishments.

What is claimed is:

1. A solar power plant wherein PV modules are placed underground, comprising:
   an underground light room, wherein sunlight is directed by way of curved arrays of mirrors to the underground light room;
   wherein the light room comprises:
     a first and second side wall,
     a floor,
     a ceiling,
     a protrusion covered with flat mirrors,
     a third side wall covered with fans as part of a cooling system,
     and a fourth side wall covered with PV modules;
   wherein the solar power plant design:
     enables higher efficiency for sunlight to electricity conversion via utilization of the plurality of flat mirrors for multiple sunlight reflections towards the PV modules,
     keeps dust and dirt away from PV module surfaces by generating a positive air pressure inside the light room,
     keeps PV module temperatures low by utilizing the fans,
     and protects the PV modules in the event of heavy rain, lightning, snow, storm, or sand storm.

2. The solar power plant of claim 1, wherein the light room further comprises:
   a gate to let sunlight in;
   wherein the light room design makes it possible to reflect the sunlight that is not absorbed by the PV modules multiple times and direct it back to the PV modules for increased electricity production;
   wherein a set of adjustable rotating flaps of the gate makes it possible to pause electricity production by closing the gate in the event of heavy rain, lightning, snow, storm, or sand storm;
   wherein the cooling system lowers operation and maintenance costs by keeping the PV module surfaces clean and protecting the PV modules.

* * * * *